(12) United States Patent
Li et al.

(10) Patent No.: US 9,420,705 B2
(45) Date of Patent: Aug. 16, 2016

(54) CURRENT CONDUCTING ELEMENT

(71) Applicant: CYNTEC CO., LTD., Hsinchu (TW)

(72) Inventors: Yi-Geng Li, Hsinchu (TW);
Chung-Hsiung Wang, Hsinchu (TW);
Hung-Ming Lin, Hsinchu (TW)

(73) Assignee: CYNTEC CO., LTD. (TW)

( * ) Notice: Subject to any disclaimer, the term of this patent is extended or adjusted under 35 U.S.C. 154(b) by 291 days.

(21) Appl. No.: 13/965,737

(22) Filed: Aug. 13, 2013

(65) Prior Publication Data

US 2014/0327031 A1    Nov. 6, 2014

(30) Foreign Application Priority Data

May 2, 2013 (TW) .............................. 102115738 A

(51) Int. Cl.
| | | |
|---|---|---|
| *H05K 3/40* | (2006.01) | |
| *H01L 23/498* | (2006.01) | |
| *H01L 33/62* | (2010.01) | |
| *H05K 1/02* | (2006.01) | |
| *H01L 33/48* | (2010.01) | |
| *H01L 23/15* | (2006.01) | |
| *H05K 1/11* | (2006.01) | |
| *H05K 1/16* | (2006.01) | |
| *H05K 1/18* | (2006.01) | |

(52) U.S. Cl.
CPC ........ *H05K 3/4061* (2013.01); *H01L 23/49827* (2013.01); *H01L 33/62* (2013.01); *H05K 1/0293* (2013.01); *H01L 23/15* (2013.01); *H01L 33/486* (2013.01); *H01L 2224/48091* (2013.01); *H01L 2224/48227* (2013.01); *H01L 2224/48465* (2013.01); *H05K 1/116* (2013.01); *H05K 1/167* (2013.01); *H05K 1/181* (2013.01); *H05K 2201/10106* (2013.01); *H05K 2203/049* (2013.01)

(58) Field of Classification Search
CPC ..... H01L 23/60; H01L 23/62; H01L 27/0292; H01L 2224/752; H01L 2224/762; H01L 2224/772; H01L 2224/782; H01L 2224/792; H01L 23/49827; H01L 23/5228; H01L 23/5252; H01L 23/5256; H01L 23/528; H01L 27/0248; H01L 27/0288; H01L 23/481
See application file for complete search history.

(56) References Cited

U.S. PATENT DOCUMENTS

| | | | | |
|---|---|---|---|---|
| 6,172,590 | B1 * | 1/2001 | Shrier | ..................... H01L 23/62 338/20 |
| 8,299,488 | B2 * | 10/2012 | Yang | ............................... 257/98 |
| 2003/0227020 | A1 * | 12/2003 | Huang | .................. H01L 25/167 257/79 |
| 2005/0155792 | A1 | 7/2005 | Ito et al. | |
| 2011/0057326 | A1 | 3/2011 | Kai et al. | |
| 2011/0260287 | A1 | 10/2011 | Lee | |
| 2013/0015943 | A1 | 1/2013 | Liu et al. | |

FOREIGN PATENT DOCUMENTS

| | | |
|---|---|---|
| CN | 1640216 | 7/2005 |
| CN | 101800102 | 8/2010 |
| CN | 102017099 | 4/2011 |
| CN | 102244070 | 11/2011 |
| TW | 200616198 | 5/2006 |
| TW | 200625363 | 7/2006 |
| TW | 201140872 | 11/2011 |
| WO | WO 9726665 A1 * | 7/1997 |

* cited by examiner

*Primary Examiner* — Jose R Diaz
(74) *Attorney, Agent, or Firm* — Kirton McConkie; Evan R. Witt

(57) ABSTRACT

A current conducting element including a substrate, a through hole, an electrode layer and a conductor structure is provided. The through hole is disposed through the substrate and has a first opening. The electrode layer is disposed on the substrate. A portion of the first opening is exposed from the electrode layer. The conductor structure is disposed in the through hole and contacted with the electrode layer. The electrode layer and the conductor structure form a current conducting path.

13 Claims, 6 Drawing Sheets

CURRENT CONDUCTING ELEMENT

FIELD OF THE INVENTION

The present invention relates to an electrical element, and more particularly to a current conducting element.

BACKGROUND OF THE INVENTION

Recently, people are increasingly dependent on various electric products in their life, in which the electric products always have circuits. Whether the structure of each of the circuits of the electric products is complex or simple, each of the electric products has some passive elements such as a resistor, a capacitor, an inductor or an over-current protecting element for protecting the circuit, etc.

FIG. 1 shows a schematic cross-section view of a conventional over-current protecting element 1. Referring to FIG. 1, the over-current protecting element 1 includes a substrate 10, a through hole 11, a first electrode layer 12, a second electrode layer 13, a conducting structure 15, and an over-current protecting structure 16. The substrate 10 has a first surface 101 and a second surface 102 opposite to the first surface 101. The through hole 11 is disposed through the substrate 10 and has openings 111 and 112. The openings 111 and 112 are respectively located on the first surface 101 of the substrate 10 and the second surface 102 of the substrate 10. The first electrode layer 12 and the second electrode layer 13 are respectively disposed on the first surface 101 of the substrate 10 and the second surface 102 of the substrate 10. The conducting structure 15 is disposed in the through hole 11 and contacted with the first electrode layer 12 and the second electrode layer 13. The conducting structure 15, the first electrode layer 12 and the second electrode layer 13 corporately form a current conducting path. The over-current protecting structure 16 is disposed on the second electrode layer 13 and located on the current conducting path. In addition, a protecting layer 17 is further disposed on the first surface 101 of the substrate 10 and located between a first electrode part 121 of the first electrode layer 12 and a second electrode part 122 of the first electrode layer 12.

As shown in FIG. 1, the first electrode layer 12, the second electrode layer 13 and the protecting layer 17 respectively cover the openings 111 and 112 of the through hole 11. In addition, when the conducting structure 15 is filled into the through hole 11, gas may be produced such that several gas bubbles are formed in the through hole 11. Therefore, when the over-current protecting element 1 is operated in a high temperature process or a testing process of thermal shock, the gas bubbles located in the through hole 11 cannot be fluently exhausted due to the pressure increase caused by rapid changes of temperature. Such that, the conducting structure 15 may be gushed from the through hole 11, and thus, the first electrode layer 12, the second electrode layer 13 and the protecting layer 17 may be peeled off.

Besides the over-current protecting element, other passive elements whose structures are similar to the over-current protecting element may also have the foregoing disadvantages. Therefore, it is an important topic to avoid the foregoing disadvantages.

SUMMARY OF THE INVENTION

The present invention provides a current conducting element to prevent an electrode layer or a protecting layer from being peeled off.

An embodiment of the present invention provides a current conducting element including a substrate, a through hole, an electrode layer, and a conductor structure. The through hole is disposed through the substrate and has a first opening. The electrode layer is disposed on the substrate, and a portion of the first opening is exposed from the electrode layer. The conductor structure is disposed in the through hole and contacted with the electrode layer. The electrode layer and the conductor structure form a current conducting path.

In an embodiment of the present invention, the substrate has a first surface and a second surface opposite to the first surface, the through hole further has a second opening, the electrode layer comprises a first electrode film and a second electrode film, the first opening is located on the first surface, the second opening is located on the second surface, the first electrode film is disposed on the first surface, and the second electrode film is disposed on the second surface.

In an embodiment of the present invention, the first electrode film includes a first electrode part and a second electrode part, a first gap is formed between the first electrode part and the second electrode part, and a portion of the first opening that is exposed from the first electrode part is located in the first gap.

In an embodiment of the present invention, the current conducting element further includes a resistance layer and a protecting layer. The resistance layer is disposed on the first surface of the substrate and located in the first gap. The protecting layer covers the resistance layer and is located in the first gap. A second gap is formed between the first electrode part and the protecting layer, the portion of the first opening that is exposed from the first electrode part is located in the second gap, and the second gap is located in the first gap.

In an embodiment of the present invention, the second electrode film includes a third electrode part and a fourth electrode part, a fourth gap is formed between the third electrode part and the fourth electrode part, and a portion of the second opening that is exposed from the third electrode part is located in the fourth gap.

In an embodiment of the present invention, the current conducting element further includes a resistance layer and a protecting layer. The resistance layer is disposed on the second surface of the substrate and located in the fourth gap. The protecting layer covers the resistance layer and is located in the fourth gap. A fifth gap is formed between the third electrode part and the protecting layer, a portion of the second opening exposed from the third electrode part is located in the fifth gap, and the fifth gap is located in the fourth gap.

In an embodiment of the present invention, the current conducting element further includes an over-current protecting structure disposed on the first electrode film and located on the current conducting path.

In an embodiment of the present invention, the current conducting element further includes an over-current protecting structure disposed on the second electrode film and located on the current conducting path.

In an embodiment of the present invention, the substrate has a central reference line vertically passing through the first surface and the second surface, a lateral wall of the through hole has a portion closest to the central reference line, and the first electrode film has a lateral side closest to the central reference line, the portion of the lateral wall is closer to the central reference line than the lateral side, an interval is formed between the portion of the lateral wall and the lateral side, and a length of the interval is between 30 μm and 50 μm.

In an embodiment of the present invention, an area of the opening of the through hole is A1 and an area of the portion of the opening that is exposed from the electrode layer is A2, and A2<½A1.

In an embodiment of the present invention, an area of the opening of the through hole is A1 and an area of the portion of the opening that is exposed from the electrode layer is A2, and 0.05≤A2/A1<0.5.

In an embodiment of the present invention, the through hole is filled with the conductor structure, and the conductor structure includes a silver gel, a copper gel, a gold gel, a tungsten gel, or a carbon gel.

In an embodiment of the present invention, the current conducting element further includes a light emitting element disposed on the electrode layer.

In an embodiment of the present invention, the light emitting element comprises a light-emitting diode (LED).

In the current conducting element of the present invention, since the portion of the first opening of the through hole is exposed from the first electrode film, the gas in the cracks inside the through hole may be fluently exhausted when the temperature is immediately raised, thereby preventing the conducting structure from gushing from the through hole. Therefore, the electrode layer or the protecting layer may not be peeled off.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
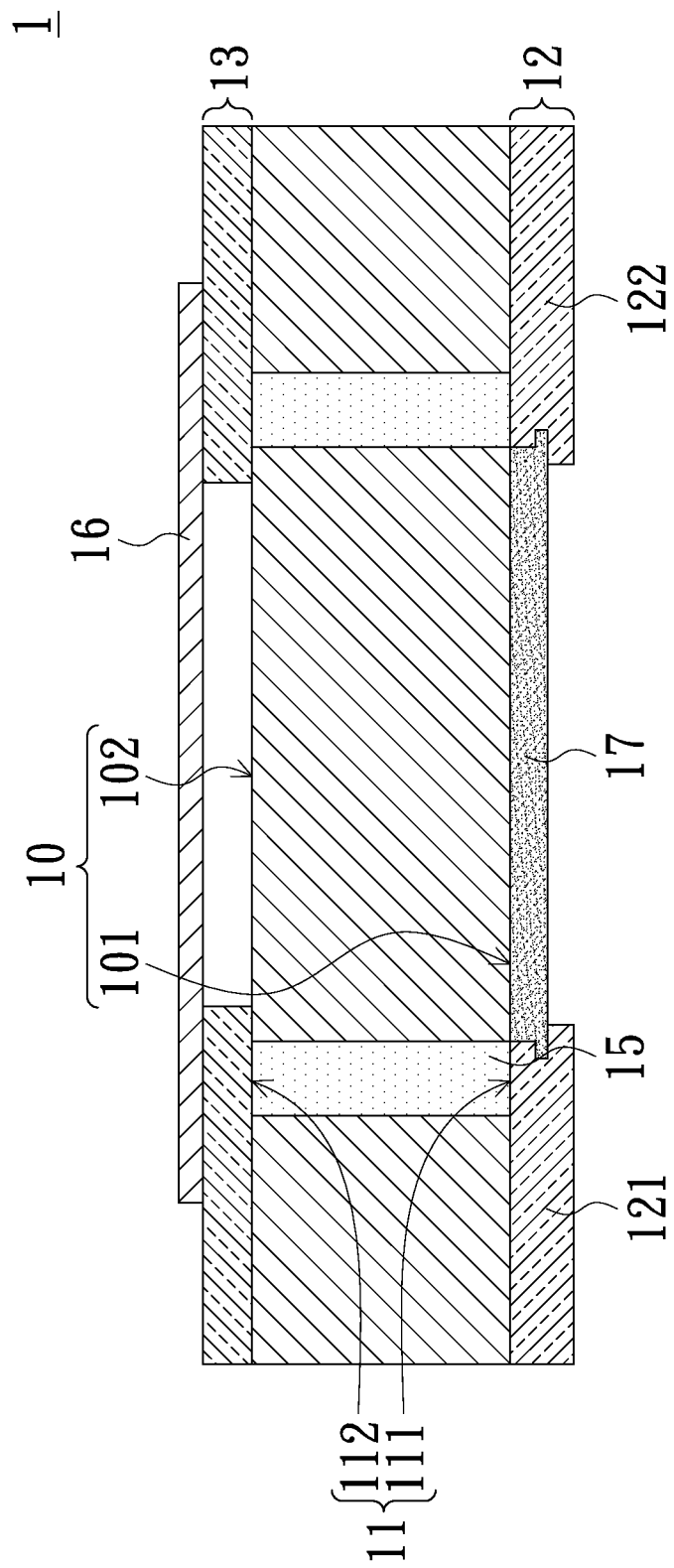
FIG. 1 illustrates a schematic cross-section view of a conventional over-current protecting element.
Figure 2:
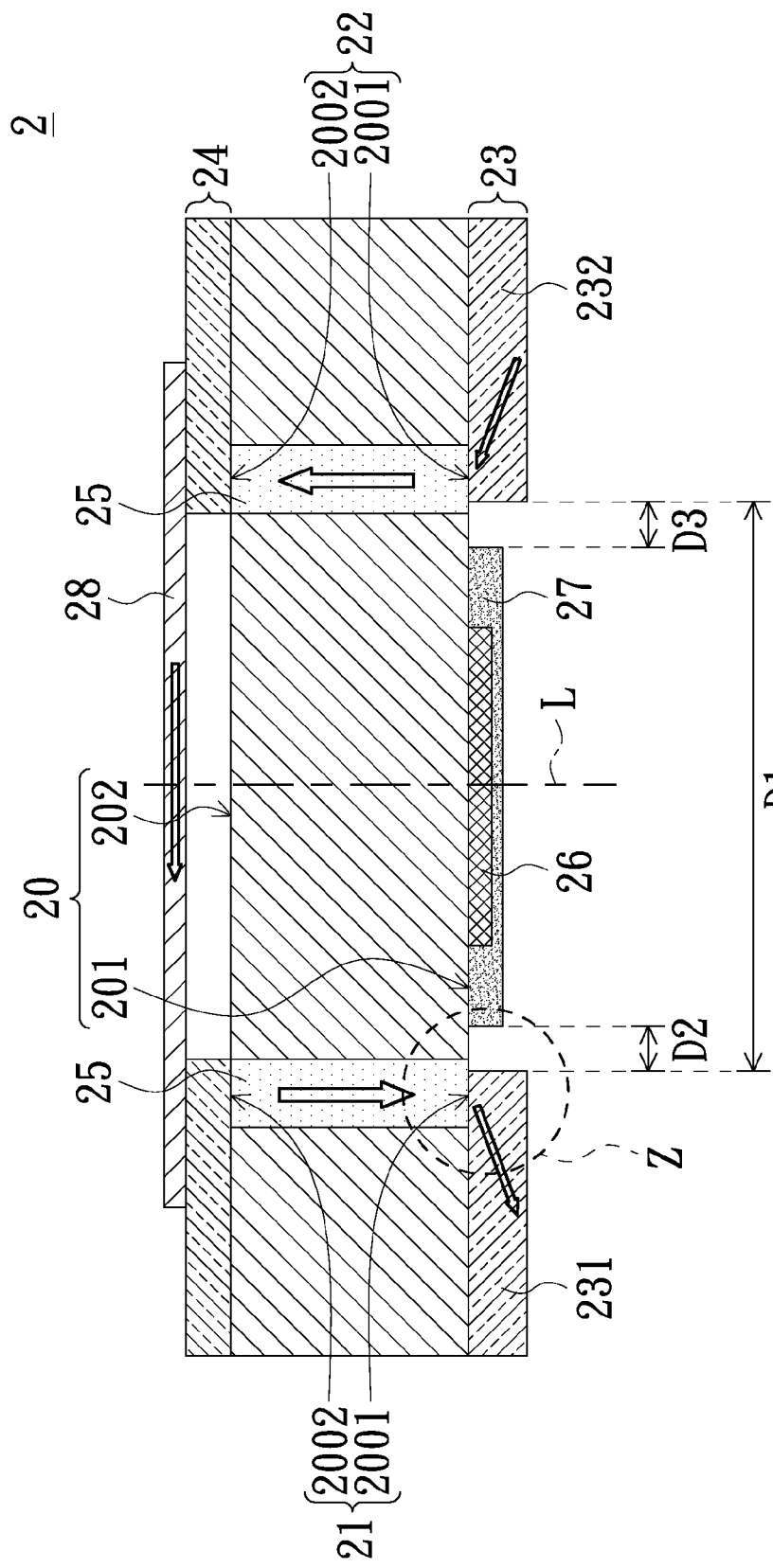
FIG. 2 illustrates a schematic cross-section view of a current conducting element according to an embodiment of the present invention.

FIG. 2 shows a schematic cross-section view of a current conducting element 2 according to an embodiment of the present invention. Referring to FIG. 2, the current conducting element 2 of the embodiment may be a protective element for providing over-current and over-voltage protection. The current conducting element 2 includes a substrate 20, at least one through hole, an electrode layer disposed on the substrate 20, and at least one conductor structure. In this embodiment, the at least one through hole, for example, includes through holes 21 and 22, the electrode layer, for example, includes a first electrode film 23 and a second electrode film 24, and the at least one conductor structure 25, for example, includes two conductor structures 25. The substrate 20 has a first surface 201 and a second surface 202 opposite to the first surface 201, the through holes 21 and 22 are respectively disposed through the substrate 20, and each of the through holes 21 and 22 has two openings 2001 and 2002. Each of the openings 2001 is located on the first surface 201 of the substrate 20, and each of the openings 2002 is located on the second surface 202 of the substrate 20. The first electrode film 23 is disposed on the first surface 201 of the substrate 20, and portions of the openings 2001 of the through hole 21 and 22 are exposed from the first electrode film 23. The second electrode film 24 is disposed on the second surface 202 of the substrate 20. The conductor structures 25 are respectively disposed in the through holes 21 and 22 and are respectively contacted with the first electrode film 23 and the second electrode film 24. In this embodiment, the first electrode film 23, the second electrode film 24 and the conductor structures 25 form a current conducting path (the current conducting path follows the direction of the indicating arrows shown in FIG. 2).

In this embodiment, the substrate 20 may be, but not limited to, an aluminum oxide substrate, an aluminum nitride substrate, a beryllium oxide substrate, a boron nitride substrate, or a glass substrate. Material of the first electrode film 23 and the second electrode film 24 may include high conductivity material such as silver, copper, gold, nickel, silver-platinum alloy or nickel alloy, etc. The conductor structures 25 are, for example, formed by performing a printing process to respectively fill a conductive adhesive into the through holes 21 and 22. The conductive adhesive may be, but not limited to, a silver adhesive, a copper adhesive, a gold adhesive, a tungsten adhesive, or a carbon ink.

The first electrode film 23, for example, includes a first electrode part 231 and a second electrode part 232. A gap D1 is formed between the first electrode part 231 and the second electrode part 232. A portion of the opening 2001 of the through hole 21 is exposed from the first electrode part 231, and a portion of the opening 2001 of the through hole 22 is exposed from the second electrode part 232. The portions of the openings 2001 respectively exposed from the first electrode part 231 and the second electrode part 232 may be, but not limited to, located in the gap D1. In another embodiment, the portions of the openings 2001 can be exposed from any positions of the first electrode part 231 and the second electrode part 232.

In this embodiment, the current conducting element 2 may further include a resistance layer 26, a protecting layer 27 and an over-current protecting structure 28. The resistance layer 26 is disposed on the first surface 201 of the substrate 20 and located in the gap D1. The protecting layer 27 covers the resistance layer 26 and is located in the gap D1. A gap D2 is formed between the first electrode part 231 and the protecting layer 27, and a gap D3 is formed between the second electrode part 232 and the protecting layer 27. In addition, the gap D2 and the gap D3 are located in the gap D1. The portion of the opening 2001 exposed from the first electrode part 231 is located in the gap D2, and the portion of the first opening 2001 exposed from the second electrode part 232 is located in the gap D3. In other words, the first electrode film 23 of the current conducting element 2 and the protecting layer 27 used for protecting the resistance layer 26 incompletely cover the openings 2001 of the through holes 21 and 22. The over-current protecting structure 28 is disposed on the second electrode film 24 and located on the current conducting path (the current conducting path follows the direction of the indicating arrow shown in FIG. 2).

The material of the protecting layer 27 may include, but be not limited to, a glass glue or an epoxy resin. The material of the resistance layer 26 may include, but be not limited to, a ruthenium oxide ($RuO_2$) or a carbon black, etc. The material of the over-current protecting structure 28 may include, but be not limited to, a low-melting-point alloy such as a lead-tin alloy, a lead-sliver-tin alloy, an indium-tin-bismuth-lead alloy, a tin-antimony alloy or a tin-sliver-copper alloy.

Figure 3:
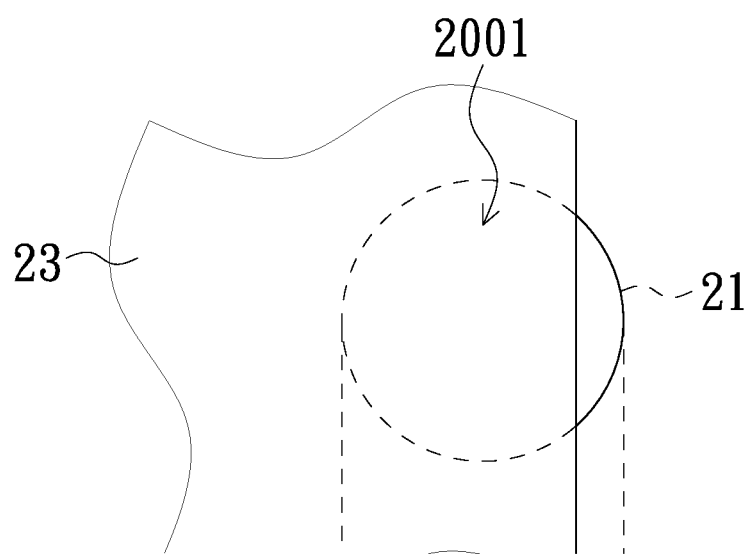
FIG. 3 illustrates a schematic bottom view corresponding to a region Z of FIG. 2.

FIG. 3 shows a schematic bottom view corresponding to a region Z of FIG. 2. As shown in FIG. 2 and FIG. 3, an area of the first opening 2001 of the through hole 21 is, for example, A1, and an area of the portion of the first opening 2001 exposed from the first electrode film 23 is, for example, A2. In this embodiment, the area A2 of the portion of the first opening 2001 exposed from the first electrode film 23 is less than one half of the area A1 of the first opening 2001 of the through hole 21 (i.e. A2<½A1). In other words, an area of the portion of the first opening 21 covered by the first electrode film 23 is greater than one half of the area A1. In a preferred embodiment, a ratio of the area A2 of the portion of the first opening 2001 exposed from the first electrode film 23 to the area A1 of the first opening 2001 of the through hole 21 is greater than or equal to 0.05 and less than 0.5 (i.e. 0.05≤A2/A1<0.5), so that the withstand current characteristics of the current conducting element 2 may be ensured.

Figure 4:
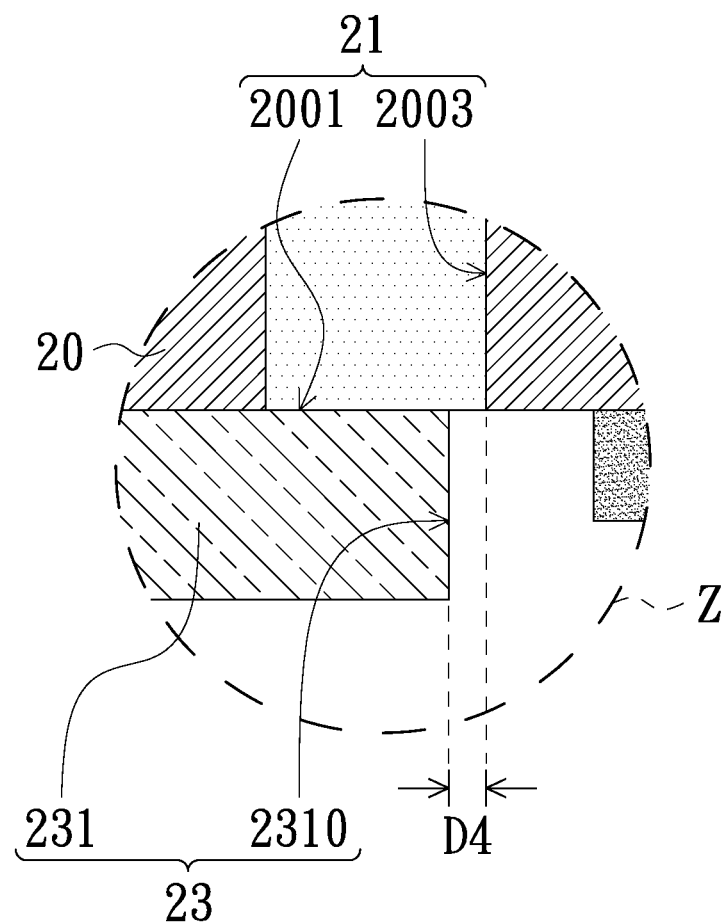
FIG. 4 illustrates a schematic enlarged view of the region Z of FIG. 2.

FIG. 4 shows a schematic enlarged view of the region Z of FIG. 2. As shown in FIG. 2 and FIG. 4, the substrate 20 has a central reference line L vertically passing through the first surface 201 and the second surface 202. A lateral wall 2003 of the through hole 21 has a portion closest to the central reference line L. The first electrode part 231 of the first electrode film 23 has a lateral side 2310 closest to the central reference line L. The portion of the lateral wall 2003 of the through hole 21 is closer to the central reference line L than the lateral side 2310 of the first electrode part 231. An interval D4 is formed between the portion of the lateral wall 2003 of the through hole 21 and the lateral side 2310 of the first electrode part 231. Specifically, a length of the interval D4 is between 30 µm and 50 µm, wherein the length of the interval D4 means a distance between the portion of the lateral wall 2003 and the lateral side 2310. When the printing process is performed to fill the conductive adhesive (e.g. the silver adhesive, the copper adhesive, or the gold adhesive, etc.) into the through holes 21 and 22 to form the conductor structures 25, alignment issue and diffusion issue of the conductor structures 25 should be considered. If the length of the interval D4 is less than 30 µm, the gas located in the inner of the through holes 21 and 22 may not be easily exhausted. If the length of the interval D4 is larger than 50 µm, the resistance value may be higher because a contact area between the first electrode film 23 and the conductor structure 25 in the through hole 21 or 22 is too small.

It should be understood that the features of the detailed structure between the opening 2002 of the through hole 22 and the second electrode part 232 of the first electrode film 23 is substantially the same with the features of the detailed structure between the opening 2001 of the through hole 21 and the first electrode part 231 of the first electrode film 23, and detailed description is omitted. Furthermore, the area of the portion of the opening 2002 exposed from the second electrode part 232 may be equal to the area of the portion of the opening 2001 exposed from the first electrode part 231. In another embodiment, the area of the portion of the opening 2002 exposed from the second electrode part 232 may not be equal to the area of the portion of the opening 2001 exposed from the first electrode part 231.

Figure 5:
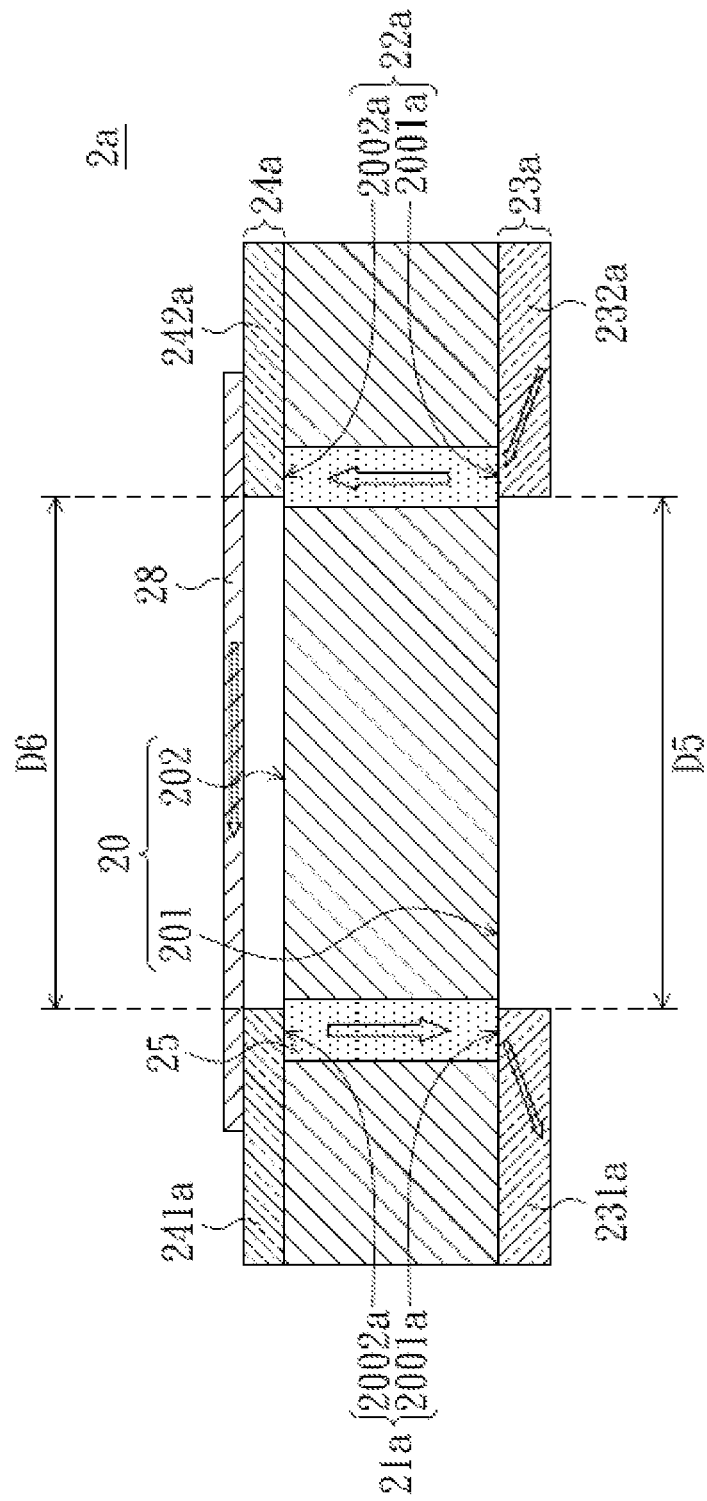
FIG. 5 illustrates a schematic cross-section view of a current conducting element according to another embodiment of the present invention.

FIG. 5 shows a schematic cross-section view of a current conducting element 2a according to another embodiment of the present invention. Referring to FIG. 5, the current conducting element 2a may be, but not limited to, an over-current protecting element. The current conducting element 2a is similar to the current conducting element 2 of FIG. 2, and only the main difference will be described below. In this embodiment, portions of the openings 2001a of the through holes 21a and 22a are exposed from the first electrode film 23a, and portions of the openings 2002a of the through holes 21a and 22a are exposed from the second electrode film 24a. More specifically, the first electrode film 23a includes a first electrode part 231a and a second electrode part 232a. The second electrode film 24a includes a third electrode part 241a and a fourth electrode part 242a. The portion of the opening 2001a of the through hole 21a is exposed from the first electrode part 231a, and the portion of the opening 2002a of the through hole 21a is exposed from the third electrode part 241a. The portion of the opening 2001a of the through hole 22a is exposed from the second electrode part 232a, and the portion of the opening 2002a of the through hole 22a is exposed from the fourth electrode part 242a. A gap D5 is formed between the first electrode part 231a and the second electrode part 232a. A gap D6 is formed between the third electrode part 241a and the fourth electrode part 242a. The portions of the openings 2001a exposed from the first electrode film 23a are located in the gap D5, and the portions of the openings 2002a exposed from the second electrode film 24a are located in the gap D6. In this embodiment, the current conducting element 2a is, for example, the over-current protecting element, and thus the current conducting element 2a does not have the resistance layer 26 as shown in FIG. 2 and the protecting layer 27 as shown in FIG. 2. Other elements of the current conducting element 2a are generally the same with the elements of the current conducting element 2 of FIG. 2, and detailed description is omitted.

Figure 6:
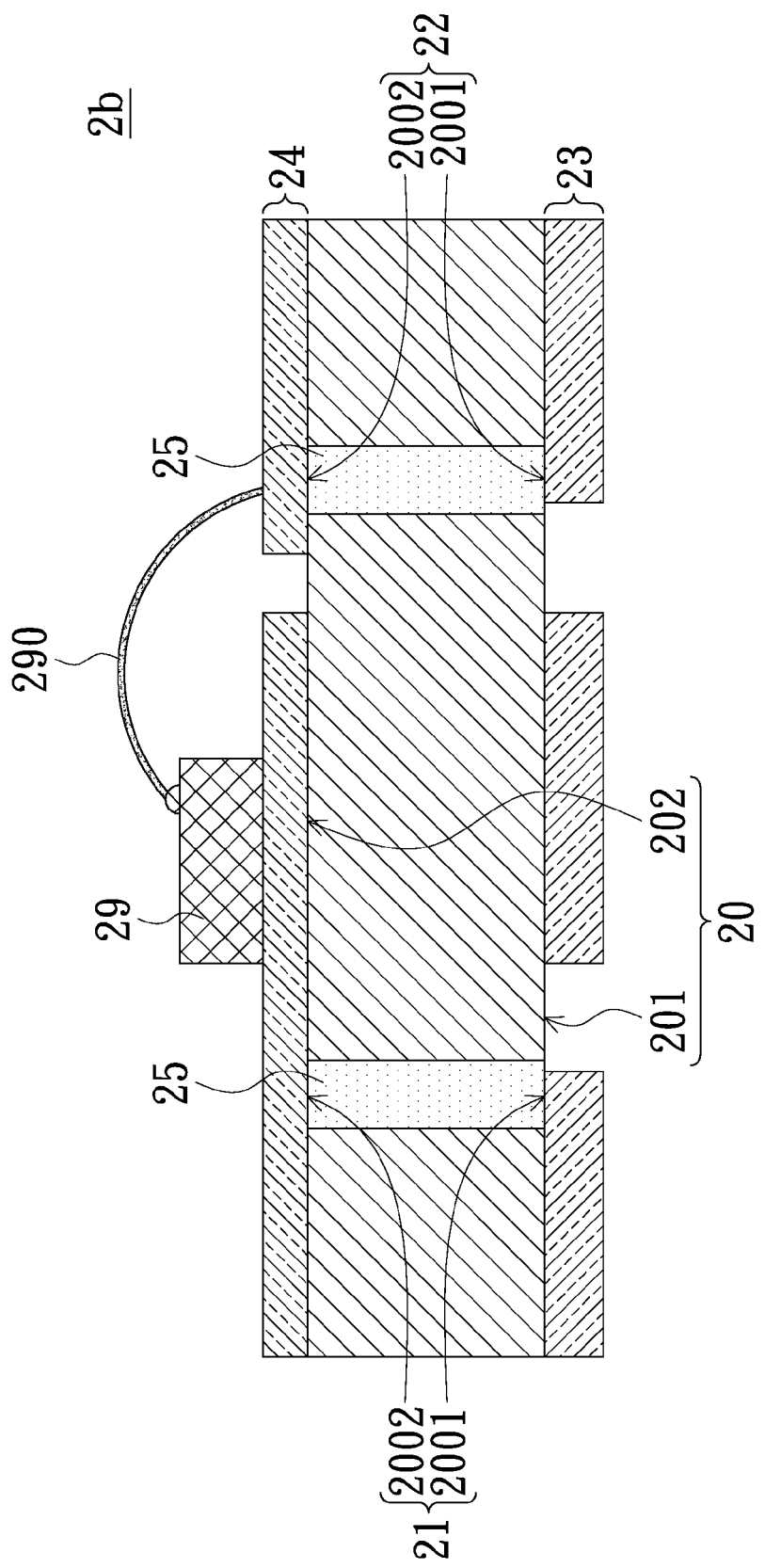
FIG. 6 illustrates a schematic cross-section view of a current conducting element according to another embodiment of the present invention.

FIG. 6 shows a schematic cross-section view of a current conducting element 2b according to another embodiment of the present invention. Referring to FIG. 6, the current conducting element 2b is, for example, a light emitting module and similar to the current conducting element 2 of FIG. 2, and thus only the main difference will be described below. Comparing with the current conducting element 2 of FIG. 2, the current conducting element 2b further includes a light emitting element 29. In this embodiment, the light emitting element 29 is disposed on the second electrode film 24 and electrically connected to the second electrode film 24 through a conducting wire 290. The light emitting element may be, but not limited to, a light-emitting diode (LED). Similarly to the current conducting element 2 of FIG. 2, in this embodiment, a portion of the opening 2001 of the through hole 21 and a portion of the opening 2001 of the through hole 22 are exposed from the first electrode film 23. In this embodiment, the current conducting element 2b is, for example, a light emitting module, and thus the current conducting element 2b does not have the resistance layer 26 as shown in FIG. 2 and the protecting layer 27 as shown is FIG. 2. Other elements of the current conducting element 2b are generally the same with the elements of the current conducting element 2 of FIG. 2.

In summary, in the current conducting element of the present invention, since the portion of the first opening of the through hole is exposed from the first electrode film, the gas in the cracks inside the through hole may be fluently exhausted when the temperature is immediately raised, thereby preventing the conducting structure from gushing from the through hole. Therefore, the electrode layer or the protecting layer may not be peeled off. The current conduction element of the present invention not only can be applied to the over-current protecting element and the light-emitting diode package structure, but also can be widely applied to other passive elements that have the similar structures.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A current conducting element, comprising:
   a substrate;
   a through hole disposed through the substrate and having a first opening, wherein an area of the first opening of the through hole is A1;
   an electrode layer disposed on the substrate and a portion of the first opening being exposed from the electrode layer, wherein an area of the portion of the first opening that is exposed from the electrode layer is A2, and A2<½A1; and
   a conductor structure disposed in the through hole, a portion of the conductor structure at the first opening being exposed from the electrode layer and the other portion of the conductor structure at the first opening being covered by and contacted with the electrode layer, wherein the electrode layer and the conductor structure form a current conducting path.

2. The current conducting element according to claim 1, wherein the substrate has a first surface and a second surface opposite to the first surface, the through hole further has a second opening, the electrode layer comprises a first electrode film and a second electrode film, the first opening is located on the first surface, the second opening is located on the second surface, the first electrode film is disposed on the first surface, and the second electrode film is disposed on the second surface.

3. The current conducting element according to claim 2, wherein the first electrode film comprises a first electrode part and a second electrode part, a first gap is formed between the first electrode part and the second electrode part, and a portion of the first opening that is exposed from the first electrode part is located in the first gap.

4. The current conducting element according to claim 3, further comprising:
   a resistance layer disposed on the first surface of the substrate and located in the first gap; and
   a protecting layer covering the resistance layer and located in the first gap, wherein a second gap is formed between the first electrode part and the protecting layer, the portion of the first opening that is exposed from the first electrode part is located in the second gap, and the second gap is located in the first gap.

5. The current conducting element according to claim 3, wherein the second electrode film comprises a third electrode part and a fourth electrode part, a fourth gap is formed between the third electrode part and the fourth electrode part, and a portion of the second opening that is exposed from the third electrode part is located in the fourth gap.

6. The current conducting element according to claim 5, further comprising:
   a resistance layer disposed on the second surface of the substrate and located in the fourth gap; and
   a protecting layer covering the resistance layer and located in the fourth gap, wherein a fifth gap is formed between the third electrode part and the protecting layer, a portion of the second opening exposed from the third electrode part is located in the fifth gap, and the fifth gap is located in the fourth gap.

7. The current conducting element according to claim 2, further comprising an over-current protecting structure disposed on the first electrode film and located on the current conducting path.

8. The current conducting element according to claim 2, further comprising an over-current protecting structure disposed on the second electrode film and located on the current conducting path.

9. The current conducting element according to claim 2, wherein the substrate has a central reference line vertically passing through the first surface and the second surface, a lateral wall of the through hole has a portion closest to the central reference line, and the first electrode film has a lateral side closest to the central reference line, the portion of the lateral wall is closer to the central reference line than the lateral side, an interval is formed between the portion of the lateral wall and the lateral side, and a length of the interval is between 30 μm and 50 μm.

10. The current conducting element according to claim 1, wherein a relation between the area A1 and the area A2 meets 0.05≤A2/A1<0.5.

11. The current conducting element according to claim 1, wherein the through hole is filled with the conductor structure, and the conductor structure comprises a silver gel, a copper gel, a gold gel, a tungsten gel, or a carbon gel.

12. The current conducting element according to claim 1, further comprising a light emitting element disposed on the electrode layer.

13. The current conducting element according to claim 12, wherein the light emitting element comprises a light-emitting diode (LED).

* * * * *